United States Patent
Kamijima et al.

(10) Patent No.: US 6,916,597 B2
(45) Date of Patent: Jul. 12, 2005

(54) METHOD FOR FABRICATING A RESIST PATTERN, A METHOD FOR PATTERNING A THIN FILM AND A METHOD FOR MANUFACTURING A MICRO DEVICE

(75) Inventors: Akifumi Kamijima, Tokyo (JP); Hisayoshi Watanabe, Tokyo (JP)

(73) Assignee: TDK Corporation, Tokyo (JP)

( * ) Notice: Subject to any disclaimer, the term of this patent is extended or adjusted under 35 U.S.C. 154(b) by 59 days.

(21) Appl. No.: 09/966,080

(22) Filed: Oct. 1, 2001

(65) Prior Publication Data

US 2002/0042029 A1 Apr. 11, 2002

(30) Foreign Application Priority Data

Oct. 5, 2000 (JP) ........................................ 2000-305683

(51) Int. Cl.[7] .............................. G03F 7/16; G03F 7/20; G03F 7/30; G03F 7/36; G03F 7/40
(52) U.S. Cl. ...................... 430/314; 430/316; 430/319; 430/328; 430/329
(58) Field of Search ................................ 430/314, 316, 430/319–320, 328–329

(56) References Cited

U.S. PATENT DOCUMENTS

| | | | | |
|---|---|---|---|---|
| 4,444,869 A | * | 4/1984 | Chonan et al. ............. | 430/313 |
| 4,894,311 A | * | 1/1990 | Uenishi et al. ............. | 430/192 |
| 5,139,904 A | * | 8/1992 | Auda et al. ................... | 430/30 |
| 5,470,491 A | * | 11/1995 | Kodama et al. .............. | 216/22 |
| 5,604,073 A | * | 2/1997 | Krounbi et al. .............. | 430/14 |
| 5,721,078 A | * | 2/1998 | Kamijima ..................... | 430/11 |
| 5,811,358 A | * | 9/1998 | Tseng et al. ................ | 438/725 |
| 5,820,770 A | * | 10/1998 | Cohen et al. ................. | 216/22 |
| 6,653,231 B2 | * | 11/2003 | Okoroanyanwu et al. ... | 438/669 |

FOREIGN PATENT DOCUMENTS

| | | |
|---|---|---|
| JP | 06-267843 A | 9/1994 |
| JP | 7-6058 B2 | 1/1995 |
| JP | 09-096909 A | 4/1997 |
| JP | 10-116402 A | 5/1998 |
| JP | 2922855 B2 | 4/1999 |
| JP | 11-233259 A | 8/1999 |
| JP | 2973874 B2 | 9/1999 |
| JP | 2000-181082 A | 6/2000 |
| JP | 2001-085407 A | 3/2001 |

* cited by examiner

Primary Examiner—Mark F. Huff
Assistant Examiner—John Ruggles
(74) Attorney, Agent, or Firm—Oliff & Berridge, PLC

(57) ABSTRACT

A thin film to be milled is formed on a substrate 1, and thereafter, a polymethylglutarimide layer and a photoresist layer are coated. Then, the photoresist layer is exposed and developed via a given mask, to form a pre-resist pattern. Then, ashing treatment is performed for the pre-resist pattern to a narrowed resist pattern. Subsequently, the thin film to be milled is milled via the resist pattern to obtain a patterned thin film.

46 Claims, 8 Drawing Sheets

METHOD FOR FABRICATING A RESIST PATTERN, A METHOD FOR PATTERNING A THIN FILM AND A METHOD FOR MANUFACTURING A MICRO DEVICE

BACKGROUND OF THE INVENTION

1. Field of the Invention

This invention relates to a method for fabricating a resist pattern, a method for patterning a thin film and a method for manufacturing a micro device.

2. Related Art Statement

Thin film-patterning is performed by using a milling method, a lift-off method or a combination method of milling and lift-off. Then, a resist pattern for the thin film-patterning is normally formed in a T-shaped cross section or a reversed trapezoid cross section, for repressing the burr from the removed material attached to the side surfaces of the resist pattern and facilitating the removal of the remaining material.

Normal exposure treatment and development treatment carried out as shown in Japanese Examined Patent publication Kokoku Hei 7-6058(JP B 7-6058), such a resist pattern is constructed of a two-layered structure, that is, a Bi-layered type resist pattern, which includes a photoresist layer as a top layer and a polymethylglutarimide layer as a bottom layer.

Moreover, the resist pattern can be fabricated as described in Japanese Patent No. 2922855. In this case, a negative working agent is added to a positive photoresist containing an alkaline soluble phenol resin and naphthoquinonediazido to prepare a photoresist material having picture inversion function. Then, the photoresist material is exposed and developed, and subsequently, heated to fabricate the resist pattern.

Furthermore, the resist pattern can be fabricated as follows: First of all, a phenol dissolution accelerator is added to a novolac type positive photoresist to prepare a so-called MG type photoresist material. Then, the MG type photoresist material is exposed and developed to fabricate the resist pattern.

However, a minute resist pattern can not be fabricated due to the optically theoretical limitation of a illumination beam to be used in the exposed process. Accordingly, only a wider resist pattern can be fabricated, and thus, only a wider thin film pattern can be fabricated.

Moreover, in the above-mentioned T-shaped or reversed trapezoid resist pattern, the lower portion is set to be narrower than the main body to define the patterning width. Therefore, the contact area between the resist pattern and a base material is narrower, compared with the total size of the resist pattern, in some case, resulting in the degradation of the adhesive strength of the resist pattern to the base material.

Accordingly, in the case that the thin film-patterning is carried out using such a resist pattern, the resist pattern is broken away at the development process, and thus, precise thin film-patterning can not be carried out.

SUMMARY OF THE INVENTION

It is an object of the present invention to provide a method for fabricating a resist pattern having a minute pattern width smaller than optically theoretical limitation, and thus, to provide a method for patterning a thin film narrowly.

In order to achieve the above object, this invention relates to a method for fabricating a resist pattern, including the steps of forming a pre-resist pattern through exposure treatment and development treatment, and ash-treating the pre-resist pattern to form the resist pattern narrowed.

Concretely, if the ashing treatment is carried out for such a Bi-layered type pre-resist pattern, a picture reversion type pre-resist pattern or a MG type pre-resist pattern as mentioned above, the desired minute resist pattern smaller than optically theoretical limitation can be obtained.

In the case that the Bi-layered type pre-resist pattern is employed, the fabricating method includes the steps of forming the polymethylglutarimide layer on a given base material, forming the photoresist layer on the polymethylglutarimide layer, exposing and developing the photoresist layer via a given mask, partially removing the remaining polymethylglutarinide layer with an alkaline water solution to form the pre-resist pattern, and ash-treating the pre-resist pattern to the narrowed resist pattern.

In the case that the picture reversion type pre-resist pattern is employed, the fabricating method includes the steps of coating the picture reversion type photoresist on a given base material, exposing the picture reversion type photoresist via a given mask, heating the picture reversion type photoresist after the exposure treatment, developing the picture reversion type photoresist after the heating treatment to form the pre-resist pattern, and ash-treating the pre-resist pattern to form the narrowed resist pattern.

In the case that the MG type pre-resist pattern is employed, the fabricating method includes the steps of coating the novolac type positive photoresist containing the additive phenol dissolution accelerator on a given base material,
exposing via a given mask and developing the novolac type positive photoresist, to form the pre-resist pattern, and ash-treating the pre-resist pattern to form the narrowed resist pattern.

Moreover, a thin film patterning method according to the present invention is characterized by using a resist pattern fabricated by the above-mentioned fabrication method or a preferred fabrication method as will be described hereinafter.

Concretely, the thin film patterning method is carried out using the resist pattern according to the present invention and a milling method, a lift-off method or a combination method of milling and lift-off.

In the case that the resist pattern made of the Bi-layered type pre-resist pattern is used and the milling method is employed, the patterning method includes the steps of forming a thin film to be milled on a given base material, forming a polymethylglutarimide layer on the thin film to be milled, forming a photoresist layer on the polymethylglutarimide layer, exposing and developing the photoresist layer via a given mask, partially removing the remaining polymethylglutarinide layer with an alkaline water solution to form a pre-resist pattern constructed of the photoresist layer as a top layer and the polymethylglutarinide layer as a bottom layer, ash-treating the pre-resist pattern to a narrowed resist pattern, and milling the thin film to be milled via the resist pattern to obtain a patterned thin film.

In the case that the resist pattern made of the picture inversion type pre-resist pattern is used and the milling method is employed, the patterning method includes the steps of forming a thin film to be milled on a given base material, coating on the thin film to be milled a picture reversion type photoresist which is made by adding a negative working agent to a positive type photoresist including a mixture of alkaline soluble phenol resin and naphtoquinonediazido, exposing the picture reversion type photoresist via a given mask, heating the picture reversion type photoresist after the exposure treatment, developing the picture reversion type photoresist after the heating treatment to form a pre-resist pattern, ash-treating the pre-resist pattern to form a narrowed resist pattern, and milling the thin film to be milled via the resist pattern to obtain a patterned thin film.

In the case that the resist pattern made of the MG type pre-resist pattern is used and the milling method is employed, the patterning method includes the steps of forming a thin film to be milled on a given base material, coating a novolac type positive photoresist containing an additive phenol dissolution accelerator on the thin film to be milled, exposing via a given mask and developing the novolac type positive photoresist, to form a pre-resist pattern, ash-treating the pre-resist pattern to form a narrowed resist pattern, and milling the thin film to be milled via the resist pattern to obtain a patterned thin film.

In the case that the resist pattern made of the Bi-layered type pre-resist pattern is used and the lift-off method is employed, the patterning method includes the steps of forming a polymethylglutarimide layer on a given base material, forming a photoresist layer on the polymethylglutarimide layer, exposing and developing the photoresist layer via a given mask, partially removing the remaining polymethylglutarinide layer with an alkaline water solution to form a pre-resist pattern constructed of the photoresist layer as a top layer and the polymethylglutarinide layer as a bottom layer, ash-treating the pre-resist pattern to a narrowed resist pattern, forming a thin film to be patterned on the base material so as to cover the resist pattern, and lifting-off the resist pattern to obtain a patterned thin film.

In the case that the resist pattern made of the picture inversion type pre-resist pattern is used and the lift-off method is employed, the patterning method includes the steps of coating on a given base material a picture reversion type photoresist which is made by adding a negative working agent to a positive type photoresist including a mixture of alkaline soluble phenol resin and naphtoquinonediazido, exposing the picture reversion type photoresist via a given mask, heating the picture reversion type photoresist after the exposure treatment, developing the picture reversion type photoresist after the heating treatment to form a pre-resist pattern, ash-treating the pre-resist pattern to form a narrowed resist pattern, forming a thin film to be patterned on the base material so as to cover the resist pattern, and lifting-off the resist pattern to obtain a patterned thin film.

In the case that the resist pattern made of the MG type pre-resist pattern is used and the lift-off method is employed, the patterning method includes the steps of coating a novolac type positive photoresist containing an additive phenol dissolution accelerator on a give base material, exposing via a given mask and developing the novolac type positive photoresist, to form a pre-resist pattern, ash-treating the pre-resist pattern to form a narrowed resist pattern, forming a thin film to be patterned on the base material so as to cover the resist pattern, and lifting-off the resist pattern to obtain a patterned thin film.

In the case that the resist pattern made of the Bi-layered type pre-resist pattern is used and the combination method of milling and lift-off is employed, the patterning method includes the steps of forming a thin film to be milled on a given base material, forming a polymethylglutarimide layer on the thin film to be milled, forming a photoresist layer on the polymethylglutarimide layer, exposing and developing the photoresist layer via a given mask, partially removing the remaining polymethylglutarinide layer with an alkaline water solution to form a pre-resist pattern constructed of the photoresist layer as a top layer and the polymethylglutarinide layer as a bottom layer, ash-treating the pre-resist pattern to a narrowed resist pattern, milling the thin film to be milled via the resist pattern to form a pre-patterned thin film, forming a thin film to be patterned on the base material so as to cover the resist pattern, and lifting-off the resist pattern to obtain a patterned thin film including the pre-patterned thin film.

In the case that the resist pattern made of the picture inversion type pre-resist pattern is used and the combination method of milling and lift-off is employed, the patterning method includes the steps of forming a thin film to be milled on a given base material, coating on the thin film to be milled a picture reversion type photoresist which is made by adding a negative working agent to a positive type photoresist including a mixture of alkaline soluble phenol resin and naphtoquinonediazido, exposing the picture reversion type photoresist via a given mask, heating the picture reversion type photoresist after the exposure treatment, developing the picture reversion type photoresist after the heating treatment to form a pre-resist pattern, ash-treating the pre-resist pattern to form a narrowed resist pattern, milling the thin film to be milled via the resist pattern to obtain a pre-patterned thin film, forming a thin film to be patterned on the base material so as to cover the resist pattern, and lifting-off the resist pattern to obtain a patterned thin film including the pre-patterned thin film.

In the case that the resist pattern made of the MG type pre-resist pattern is used and the combination method of milling and lift-off is employed, the patterning method includes the steps of forming a thin film to be milled on a given base material, coating a novolac type positive photoresist containing an additive phenol dissolution accelerator on the thin film to be milled, exposing via a given mask and developing the novolac type positive photoresist, to form a pre-resist pattern, ash-treating the pre-resist pattern to form a narrowed resist pattern, milling the thin film to be milled via the resist pattern to obtain a pre-patterned thin film, forming a thin film to be patterned on the base material so as to cover the resist pattern, and lifting-off the resist pattern to obtain a patterned thin film including the pre-patterned thin film.

According to the resist pattern-fabricating method of the present invention, the pre-resist pattern fabricated by a conventional method is narrowed to a smaller size than its optically theoretical limitation by the above ashing treatment, so a narrower resist pattern than its optically theoretical limitation can be obtained.

Therefore, according to the thin film-pattering method of the present invention using the narrowed resist pattern, a minute patterning can be performed for a thin film.

Moreover, in fabricating the pre-resist pattern in a T-shaped cross section or a reversed trapezoid cross section, the contact area between the pre-resist pattern and a base material can be increased, as compared with the main body of the pre-resist pattern. Therefore, the adhesive strength of the pre-resist pattern to the base material can be enhanced, so that the pre-resist pattern is not almost broken away of the base material at the development treatment.

Moreover, although the contact area to the base material of the pre-resist pattern is reduced due to the configuration, the pre-resist pattern is not almost broken away of the base material and toppled at the ashing treatment because physical strength is not applied to the pre-resist pattern.

Since the resist pattern is narrowed by the ashing treatment, the rising angle of the main body of the resist pattern is increased, and thus, gently sloped or the rising portion of the main body is roundly shaped. As a result, the patterning width of the thin film is defined by the nearby portion to the bottom portion of the main body of the resist pattern, and thus, is narrowed, as compared with the patterning width by the conventional method, in which the patterning width is defined by a maximum width of the resist pattern.

In the resist pattern-fabricating method and the thin film-patterning method of the present invention, the wording "given base material" means a single substrate or a combination of a substrate and an underlayer for a thin film to be milled or a micro device.

Moreover, the "ashing treatment" means the burning up and removing treatment for an organic thin film using oxygen plasma.

BRIEF DESCRIPTION OF THE DRAWINGS

For a better understanding of this invention, reference is made to the attached drawings, wherein.

DETAILED DESCRIPTION OF PREFERRED EMBODIMENTS

This invention will be explained in detail, with reference to the attaching drawings, hereinafter.

FIGS. 1–7 are cross sectional views showing a thin film-patterning method according to the present invention. In this embodiment, a Bi-layered type pre-resist pattern is employed to form a resist pattern, and then, the thin film patterning is carried out via the resist pattern by a milling method.

Figure 1:
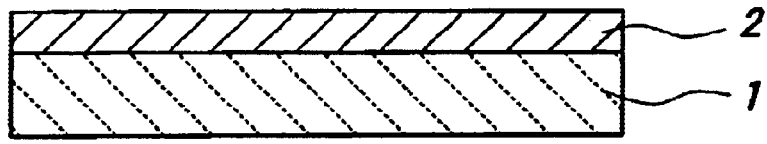
FIG. 1 is a cross sectional view showing a first step of a thin film-patterning method according to the present invention.
Figure 2:
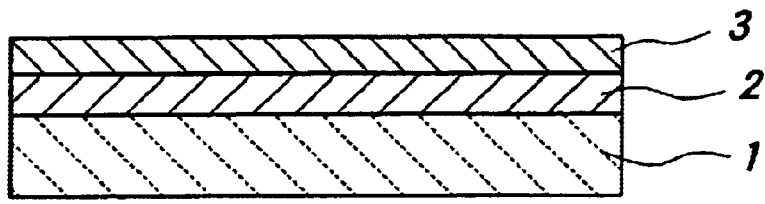
FIG. 2 is a cross sectional view showing the next step after the first step shown in FIG. 1.
Figure 3:
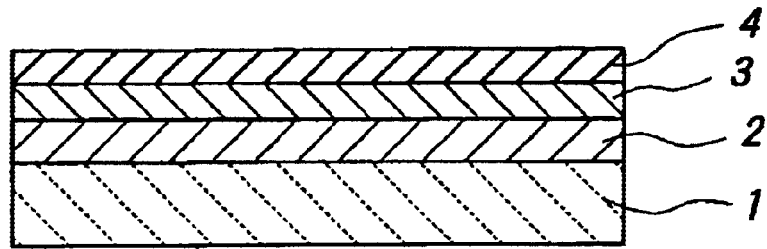
FIG. 3 is a cross sectional view showing the next step after the step shown in FIG. 2.

First of all, as shown in FIG. 1, a thin film 2 to be milled is formed on a substrate 1 by a sputtering method or the like. Then, as shown in FIG. 2, a polymethylglutarimide (hereinafter, often abbreviated as "PMGI") layer 3 is coated on the thin film 2 to be milled. Then, as shown in FIG. 3, a photoresist layer 4 of, e.g., positive type is coated on the PMGI layer 3.

Figure 4:
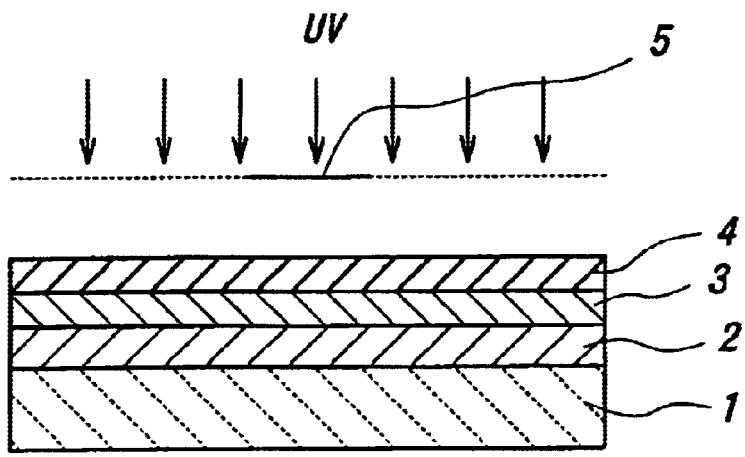
FIG. 4 is a cross sectional view showing the next step after the step shown in FIG. 3.
Figure 5:
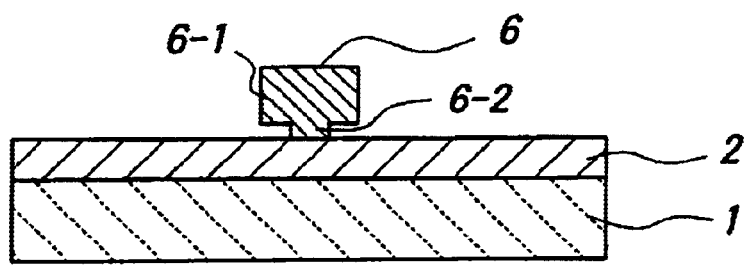
FIG. 5 is a cross sectional view showing the next step after the step shown in FIG. 4.
Figure 6:
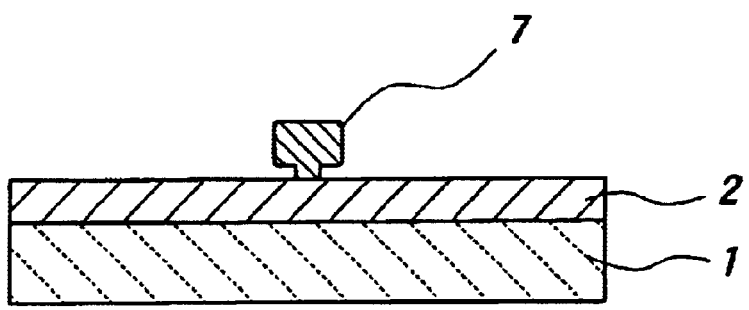
FIG. 6 is a cross sectional view showing the next step after the step shown in FIG. 5.
Figure 7:
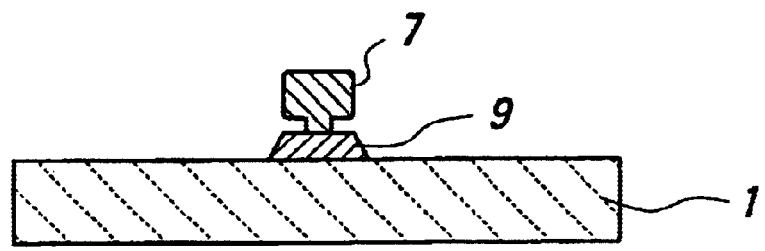
FIG. 7 is a cross sectional view showing the next step after the step shown in FIG. 6, FIG. 8 a cross sectional view showing a step of another thin film-patterning method according to the present invention.

Thereafter, as shown in FIG. 4, the photoresist layer 4 is exposed via a given mask through UV irradiation or the like. Then, the photoresist layer 4 is developed and the remaining PMGI layer is partially removed by a given alkaline water solution, to form a T-shaped pre-resist pattern 6 as shown in FIG. 5. Thereafter, the pre-resist pattern 6 is ash-treated to fabricate a narrowed resist pattern 7 as shown in FIG. 7.

Concretely, the ashing treatment is performed by setting the substrate 1 with the pre-resist pattern 6 into an oxygen plasma atmosphere generated by a high frequency coil or planar electrodes. In this case, the substrate 1 is set so that the pre-resist pattern 6 is disposed in the center of the oxygen plasma atmosphere. Therefore, without the oxygen plasma damage for the substrate 1 and the thin film 2 to be milled, only the pre-resist pattern can be ash-treated precisely.

Moreover, at least one of fluorine-based gas and nitrogen/hydrogen gas mixture is added to the oxygen plasma. In this case, the thus obtained mixed gas plasma is employed for the ashing treatment. Due to the mixed gas plasma, the ashing speed can be enhanced and thus, the efficiency of the ashing treatment can be also enhanced. As the fluorine-based gas, fluorine tetrachloride is exemplified.

Then, the thin film 2 to be milled is milled via the resist pattern 7, and thus, patterned in minute. As a result, a minute patterned thin film 9 as shown in FIG. 7 can be obtained. The resist pattern 7 is removed by a given solvent.

Figure 8:
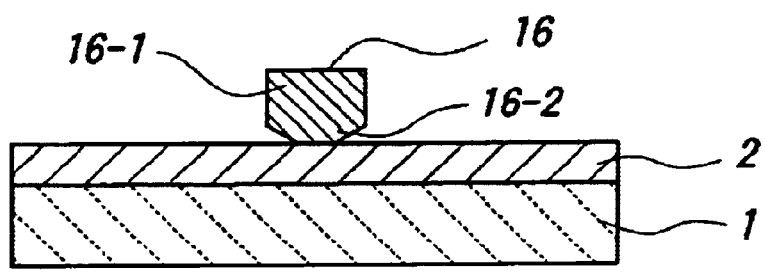
Figure 9:
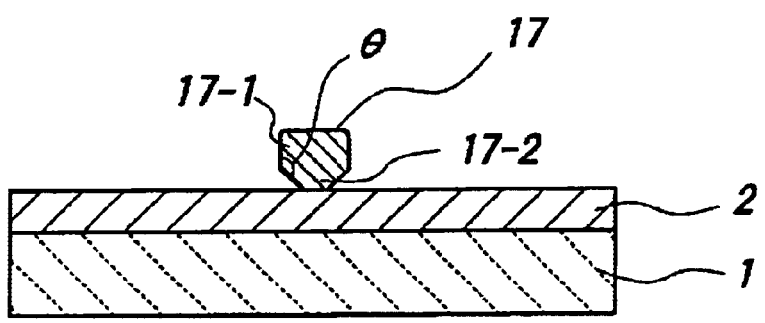
FIG. 9 is a cross sectional view showing the next step after the step shown in FIG. 8.

In this embodiment, the T-shaped pre-resist pattern 6 is fabricated, but a reversed trapezoid pre-resist pattern 16 as shown in FIG. 8 may be fabricated by controlling the dissolution and removal period of the PMGI layer for the alkaline solution and the concentration of the alkaline solution. For example, the dissolution and removal period is set to be shorter, and/or the concentration of the alkaline concentration is set to be lower, as compared in fabricating the T-shaped pre-resist pattern 6. Thereafter, the pre-resist pattern 16 is ash-treated to obtain a narrowed reversed trapezoid resist pattern 17.

When the patterned thin film 9 is formed with the T-shaped or the reversed trapezoid resist pattern 7 or 17, the milled material shattered from the thin film 2 is almost stuck on the not narrowed main body 7-1 or the not narrowed main body 17-1 of the respective resist patterns 7 and 17. Therefore, since the milled material is removed when the resist pattern is dissolved and removed, no burr is created. Moreover, in the removal of the resist pattern, since a given solvent is penetrated entirely, the resist pattern can be effectively removed.

By fabricating the T-shaped resist pattern 6 or the reversed trapezoid resist pattern 16 thorough the ashing treatment, the contact areas between the bottom portions 6-2 and 16-2 of the pre-resist patterns 6 and 16 and the thin films 2 can be enlarged to some degree for the main bodies 6-1 and 16-1. The adhesive strength of the pre-resist patterns 6 and 16 for the thin films 2 can be enhanced, and thus, the break away of the pre-resist patterns 6 and 16 can be prevented at the development process.

Moreover, despite of the reduction of the absolute contact area for the thin films 2, physical strength is not applied to the pre-resist patterns 6 and 16 at the ashing treatment, the upset and break away of the narrowed resist patterns 7 and 17 can be prevented.

Furthermore, due to the above ashing treatment, the rising angle θ of the main body 17-1 is enlarged and thus, softly sloped. Or the main body 17-1 is roundly shaped. Therefore, as compared with a conventional patterning method in which the width of the patterned thin film is defined as a maximum width portion of the resist pattern, the width of the thus obtained patterned thin film can be much narrowed.

In the case that a picture reversion type pre-resist pattern is employed to form a resist pattern, and then, the thin film patterning is carried out via the resist pattern by a milling method, fundamentally, the thin film patterning process can be performed in the same manner as FIGS. 1–7.

However, instead of forming the PMGI layer and the positive photoresist in FIGS. 2 and 3, the picture reversion type photoresist is coated. The photoresist type of the picture reversion type photoresist is changed to negative type from positive type due to the picture reversion function, so that for fabricating the patterned thin film 9 as shown in FIG. 7, a mask having an opening corresponding to the mask 5 is used. Then, the exposure treatment and the heating treatment are carried out and then, the development treatment is carried out. By the heating treatment, a decarbonylation is brought about.

In this case, by controlling the exposure treatment condition and the development condition appropriately, a T-shaped or a reversion trapezoid pre-resist pattern can be obtained. For example, as the development treatment period is elongated and/or the concentration of the developing solution, the shape of the pre-resist pattern is shifted to the T-shape from the reversion trapezoid shape.

In the case of using the picture reversion type photoresist, the photo-resist layer may be exposed uniformly after the heating treatment and before the development treatment. Thereby, the unexposed portion of the photoresist layer can be effectively exposed, and thus, without the dense developing solution, etc., the T-shaped or the reversion trapezoid resist pattern can be easily formed.

As an alkaline soluble phenol resin to compose the picture reversion type photoresist, phenolformaldehyde novolac type resin and crezolformaldehyde novolac type resin may be exemplified, as described in Japanese Patent No. 29228555.

As a naphthoquinonediazido to compose the picture reversion type photoresist, hydroxyl compound and o-benzo or o-naphthoquinonediaziodesulphonic acid ester, as described in Japanese Patent No. 29228555.

As a negative working agent having picture reversion function, aromatic hydrocarbon having amino group or hydroxyl group, 1-hydroxyethyl-2-alkylimidazolidine, and shellac may be exemplified.

In the case that a MG type pre-resist pattern is employed to form a resist pattern, and then, the thin film patterning is carried out via the resist pattern by a milling method, fundamentally, the thin film patterning process can be performed in the same manner as FIGS. 1–7.

However, instead of forming the PMGI layer and the positive photoresist in FIGS. 2 and 3, the MG type photoresist is coated. Thereafter, according to the steps as shown in FIGS. 4 and 5, the exposure treatment and the development treatment are carried out to form the pre-resist pattern. Subsequently, the pre-resist pattern is ash-treated to form a narrowed resist pattern.

In this case, after the MG type photoresist is coated and/or in between the exposure treatment and the development treatment, for facilitating the shift of a dissolution accelerator to the substrate, the photoresist layer may be heated.

Also, by controlling the exposure treatment condition and the development condition appropriately, a T-shaped or a reversion trapezoid pre-resist pattern can be obtained, and thus, a narrowed resist pattern can be obtained. For example, as the development treatment period is elongated and/or the concentration of the developing solution, the shape of the pre-resist pattern is shifted to the T-shape from the reversion trapezoid shape.

As a phenol dissolution accelerator to be used in the MG type photoresist, low nucleic substance having phenolhydroxyl group and 2-5 benzene rings may be used, as Japanese Patent No. 2973874. Concretely, the substance is designated by the following structural formulas (1) and (2)

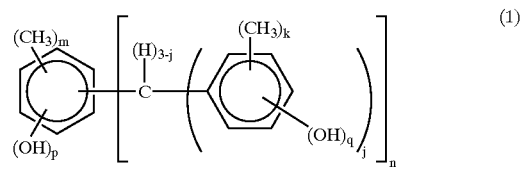

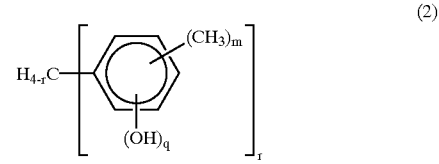

(j:1 or 2, k,m,p:0–3, n:1–4, q:1–3, r:2 or 3, m+p+n≦6, k+q≦5)

Next, a Bi-layered type pre-resist pattern is employed to form a resist pattern, and then, the thin film patterning is carried out via the resist pattern by a lift-off method. FIGS. 10–15 are cross sectional views showing the thin film-patterning method according to the present invention.

Figure 10:
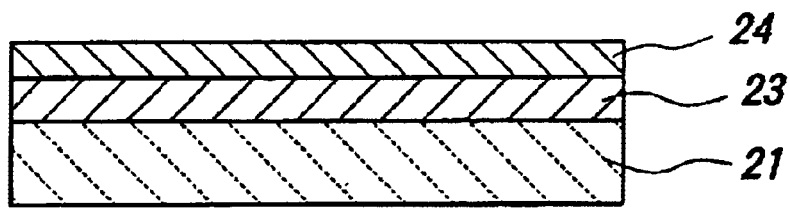
FIG. 10 is a cross sectional view showing a first step of still another thin film-patterning method according to the present invention.
Figure 11:
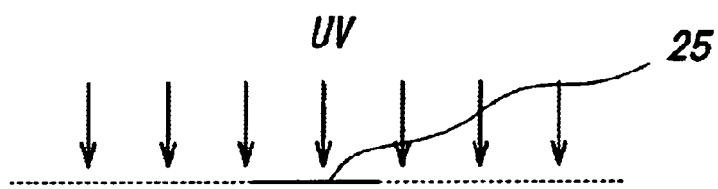
FIG. 11 is a cross sectional view showing the next step after the step shown in FIG. 10.
Figure 11:
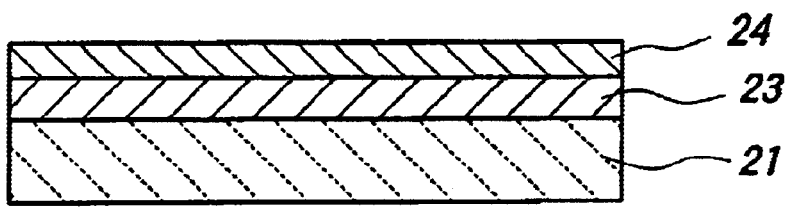
Figure 12:
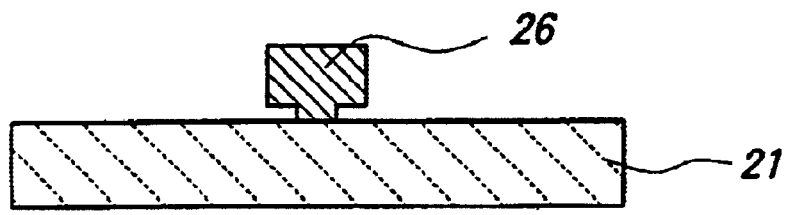
FIG. 12 is a cross sectional view showing the next step after the step shown in FIG. 11.

First of all, as shown in FIG. 10, a PMGI layer 23 and a positive type photoresist are coated on a substrate 21. Then, as shown in FIG. 11, the photoresist layer 24 is exposed through UV irradiation via a given mask 25. Then, the photoresist layer 24 is developed, and the remaining PMGI layer 23 is partially removed by a given alkaline water solution to form a pre-resist pattern 26 as shown in FIG. 12.

Figure 13:
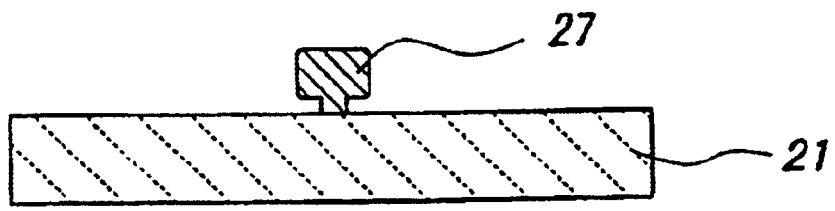
FIG. 13 is a cross sectional view showing the next step after the step shown in FIG. 12.
Figure 14:
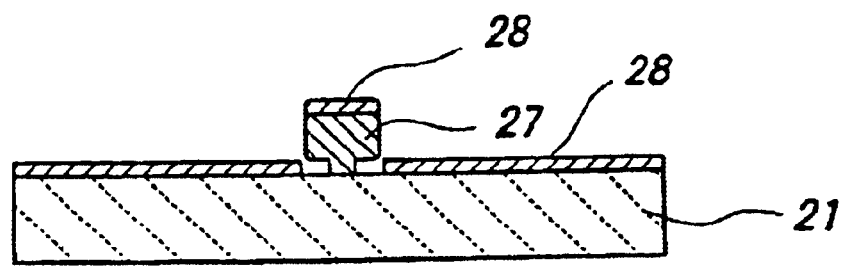
FIG. 14 is a cross sectional view showing the next step after the step shown in FIG. 13.
Figure 15:
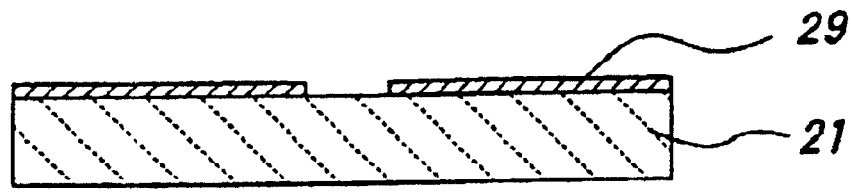
FIG. 15 is a cross sectional view showing the next step after the step shown in FIG. 14.

Then, the pre-resist pattern 26 is narrowed by the ashing treatment as mentioned above, to form a narrowed resist pattern 27 as shown in FIG. 13. Subsequently, a thin film 28 to be patterned is formed on the substrate 21 so as to cover the resist pattern 27. Thereafter, the resist pattern 27 is dissolved and removed with a given organic solvent, to form a patterned thin film 29.

In the case that a picture reversion type pre-resist pattern is employed to form a resist pattern, and then, the thin film patterning is carried out via the resist pattern by a lift-off method, instead of forming the PMGI layer and the positive type photoresist, the single picture reversion type photoresist is coated, and the exposure treatment, the heating treatment and the development treatment are carried out in turn. Thereafter, the patterned thin film is fabricated by the same manner as in FIGS. 13–15.

As mentioned above, in this case, since the photoresist type of the picture reversion type photoresist is changed to negative type from positive type due to the picture reversion function, a mask having an opening corresponding to the mask 25 is used. Moreover, as mentioned above, the uniform exposure treatment may be carried out for the photoresist layer.

In the case that a MG type pre-resist pattern is employed to form a resist pattern, and then, the thin film patterning is carried out via the resist pattern by a lift-off method, instead of forming the PMGI layer and the positive type photoresist, the single MG type photoresist is coated, and the exposure treatment, the heating treatment and the development treatment are carried out by the same manner as in FIGS. 11–15.

In the case of using the lift-off method for the thin film patterning, by controlling the exposure condition and the development condition appropriately, a T-shaped or a reversed trapezoid resist pattern can be made.

Figure 16:
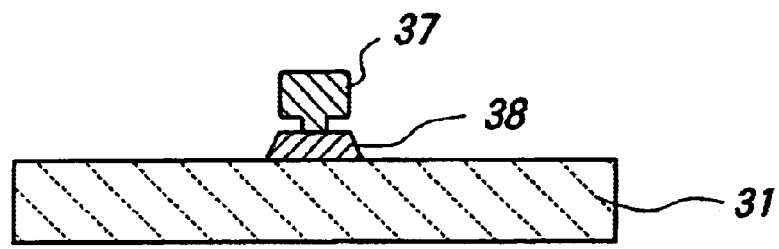
FIG. 16 is a cross sectional view showing a step of a further thin film-patterning method according to the present invention.
Figure 17:
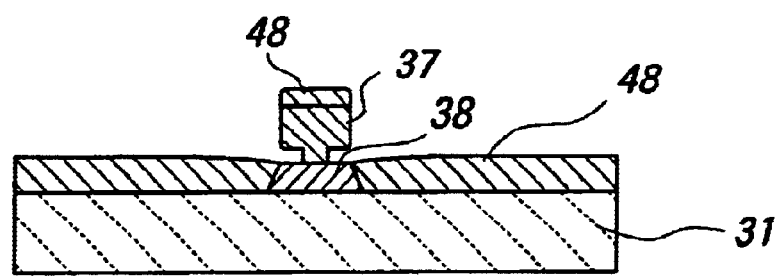
FIG. 17 is a cross sectional view showing the next step after the step shown in FIG. 16.
Figure 18:
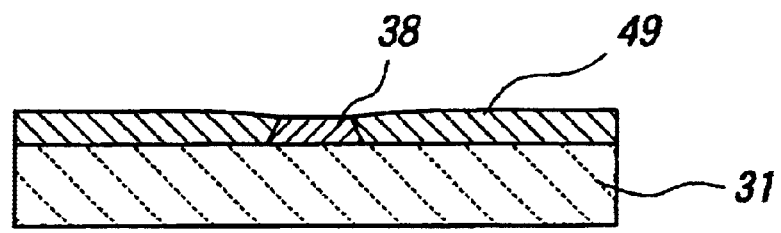
FIG. 18 is a cross sectional view showing the next step after the step shown in FIG. 17.

Next, a Bi-layered type pre-resist pattern is employed to form a resist pattern, and then, the thin film patterning is carried out via the resist pattern by a milling method and a lift-off method. FIGS. 16–18 are cross sectional views showing the thin film-patterning method according to the present invention.

First of all, according to the thin film-patterning steps as shown in FIGS. 1–6, a pre-patterned thin film 38 and a resist pattern 37 are formed on a substrate 31 as shown in FIG. 16. Then, as shown in FIG. 17, a thin film 48 to be patterned is formed on the substrate 31 so as to cover the resist pattern 37 by the same manner as the thin film patterning using the lift-off method. Thereafter, the remaining resist pattern 37 is dissolved and partially removed, and thus, a patterned thin film 49 as shown in FIG. 18 can be formed.

In the thin film-patterning method using the milling method and the lift-off method, the picture reversion type photoresist or the MG type photoresist may be employed to form the above-mentioned patterned thin film, and thus, the similar narrowed patterned thin film can be formed.

The resist pattern-fabricating method and the thin film-patterning method according to the present invention may be preferably employed for a micro device such as a semiconductor laser, an optical isolator, a micro actuator and thin film magnetic head particularly, the methods are preferably employed for a thin film magnetic head requiring miniaturization in light of high density recording/reproducing.

Next, a fabrication process of a giant magnetophotoresistive effective element (hereinafter, often abbreviated as "GMR element") of a thin film magnetic head using the resist pattern-fablicating method and the thin film-patterning method will be described. FIGS. 19–22 are fabrication process charts of the GMR element, and show the cross sectional views, taken on the line parallel to the ABS of the magnetic pole portion (parallel direction to the medium opposing surface).

Figure 19:
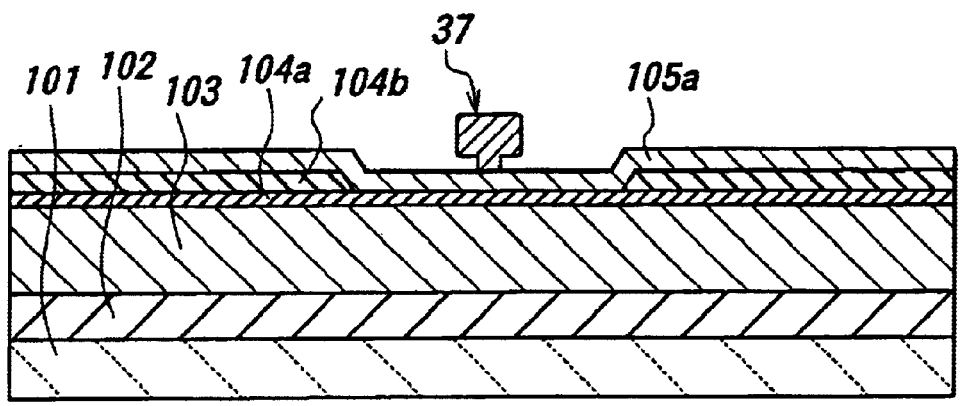
FIG. 19 is a cross sectional view showing a manufacturing step of a thin film magnetic head using a resist pattern-fabricating method and a thin film-patterning method according to the present invention.

First of all, as shown in FIG. 19, an insulating layer 102 is formed of alumina (A1203), etc., on a substrate 101 made of AlTiC (A1203 ·TiC). Then, a bottom shielding layer 103 for the playback head is formed of a magnetic material on the insulating layer 102. Then, a first shielding gap thin film 104a is formed of an insulating material such as alumina on the bottom shielding layer 103.

Then, a second shielding gap thin film 104b is formed of an insulating material such as alumina, except the area for the GMR element to be formed, on the first shielding gap thin film. Then, a magnetic layer 105a to be fabricated as the GMR element is formed on the second shielding gap thin film 104b subsequently, a resist pattern 37 is formed on the area for the GMR element to be formed according to the process shown in FIGS. 1–6.

Figure 20:
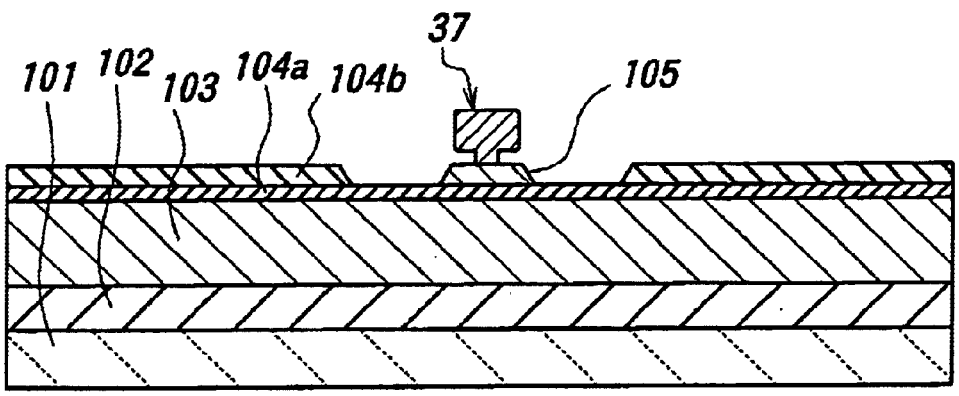
FIG. 20 is a cross sectional view showing the next step after the step shown in FIG. 19.

Then, as shown in FIG. 20, the magnetic layer 105a is selectively etched by ion milling using the resist pattern 37 as a mask, to form the GMR element 105. Next, as shown in FIG. 21, a pair of leading layers 106 to be electrically connected to the GMR element are formed entirely on the first shielding gas thin film 104a, the second shielding gap thin film 104 and the resist pattern 37, according to the fabrication step shown in FIG. 17.

Figure 21:
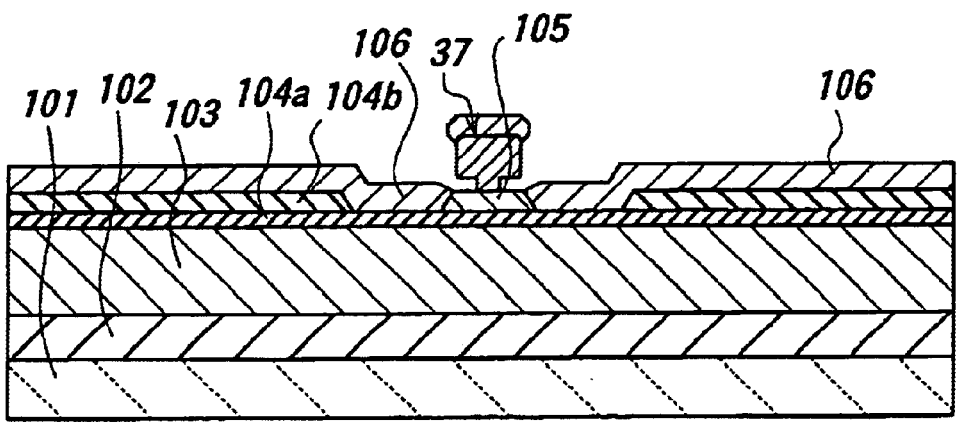
FIG. 21 is a cross sectional view showing the next step after the step shown in FIG. 20.

That is, in the fabrication steps shown in FIGS. 19–21, a milling method and a lift-off method are employed to fabricate the patterned thin film constructed of the GMR element 105 and the pair of leading layers 106.

Figure 22:
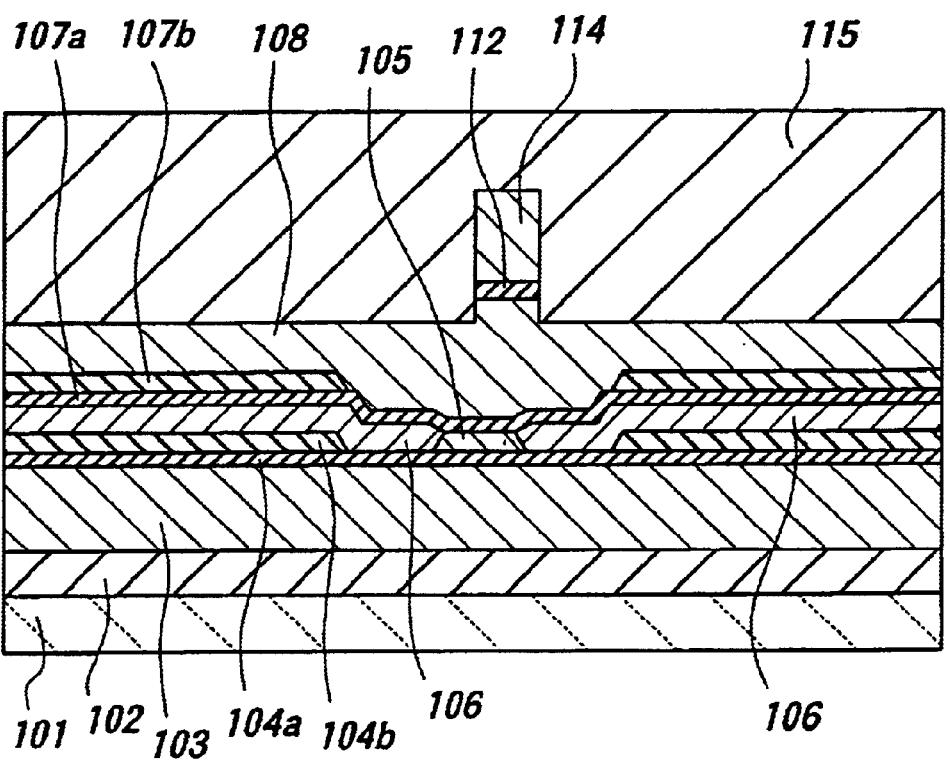
FIG. 22 is a cross sectional view showing the next step after the step shown in FIG. 21.

Then, as shown in FIG. 22, a third shielding gap thin film 107a is formed of an insulating material such as alumina on the shielding gap thin films 104a, 104b, the GMR element 105 and the leading layers 106, and the GMR element 105 is embedded in between the shielding gap thin films 104a and 107a. Subsequently, except the nearby area to the GMR element 105, a fourth shielding gap thin film 107b is formed of an insulating material such as alumina on the third shielding gap thin film 107a.

Thereafter, a bottom magnetic layer 108 as a top shielding layer, a write gap layer 112, a top magnetic layer 114, not shown a thin film coil and a protective layer 115 are formed in turn, and the ABS is polished, thereby to complete a thin film magnetic head. In FIG. 22, the side surfaces of the top shielding layer is self-aligned to construct the trim structure.

This invention has been described in detail with reference to the above preferred concrete embodiments, but it is obvious for the ordinary person skilled in the art that various modifications can be made in its configuration and detail without departing from the scope of this invention.

As mentioned above, according to the resist pattern-fabricating method of the present invention, the pre-resist pattern formed by a conventional fabricating method is ash-treated and thus, much narrowed. Therefore, the thus obtained resist pattern can be narrowed beyond the optically theoretical limitation. Then, according to the thin film-patterning method of the present invention using the narrowed resist pattern, a minute patterned thin film can be obtained.

In the case that the T-shaped or the reversed trapazoid pre-resist pattern is formed according to the present invention, the contact area of the pre-resist pattern to the base material can be enlarged, as compared with the size of the main body of the pre-resist pattern. Therefore, the adhesive strength of the pre-resist pattern to the base material can be enhanced to some degree, and thus, the precise thin film patterning can be carried out through the prevention of the break away of the thus obtained resist pattern.

Moreover, despite of the smaller contact area of the pre-resist pattern to the base material, the break away and the upset of the thus obtained resist pattern can be prevented because physical strength can not be applied to the pre-resist pattern at the ashing treatment.

Moreover, due to the ashing treatment, the rising angle of the main body of the resist pattern is increased, and thus, gently sloped or the rising portion of the main body is roundly shaped. As a result, the patterning width of the thin film is defined by the nearby portion to the bottom portion of the main body of the resist pattern, and thus, is narrowed, as compared with the patterning width by a conventional method, in which the patterning width is defined by a maximum width of the resist pattern.

What is claimed is:

1. A method for fabricating a resist pattern narrowed below an optically theoretical limitation, comprising:

forming a pre-resist pattern through exposure treatment and development treatment, said pre-resist pattern being made of a photoresist layer as a top layer and a polymethylglutanmide layer as a bottom layer;

increasing bond strength between the pre-resist pattern and a base material by increasing an amount of relative contact area of the pre-resist pattern and the base material by ash-treating the pre-resist pattern; and ash-treating the pre-resist pattern to form the narrowed resist pastern.

2. A fabricating method as defined in claim 1, wherein the ashing treatment is carried out by using a process gas composed of oxygen gas containing at least one of fluorine-based gas and nitrogen/hydrogen gas mixture.

3. A fabricating method as defined in claim 1, further comprising:

forming the polymethylglutarimide layer on a given base material;

forming the photoresist layer on the polymethylglutanmide layer;

exposing and developing the photoresist layer via a given mask;

partially removing the remaining polymethylglutariniide layer with an alkaline water solution to form the pre-resist pattern; and ash-treating the pre-resist pattern to form the narrowed resist pattern.

4. A fabricating method as defined in claim 3, wherein the pre-resist pattern has a T-shaped or reversed trapezoid longitudinal cross-section, and the narrowed resist pattern has a corresponding T-shaped or reversed trapezpid cross-section.

5. A fabricating method as defined in claim 1, wherein the pre-resist pattern and the resist pattern are made of a picture reversion photoresist which is made by adding a negative working agent to a positive photoresist including a mixture of alkaline soluble phenol resin and napthoquinonediazide.

6. A fabricating method as defined in claim 5, farther comprising:

coating the picture reversion photoresist on a given base material;

exposing the picture reversion photoresist via a given mask;

heating the picture reversion photoresist after the exposure treatment;

developing the picture reversion photoresist after the heating treatment to form the pre-resist pattern; and ash-treating the pre-resist pattern to form the narrowed resist pattern.

7. A fabricating method as defined in claim 6, further comprising exposing the picture reversion photoresist uniformly after the heating treatment and before the developing treatment.

8. A fabricating method as defined in claim 6, wherein the pre-resist pattern has a T-shaped or reversed trapezoid longitudinal cross section, and the narrowed resist pattern has a corresponding T-shaped or reversed trapezoid cross-section.

9. A fabricating method as defined in claim 1, wherein the pre-resist pattern and the resist pattern are made of a novolac positive photoresist containing an additive phenol dissolution accelerator.

10. A fabricating method as defined in claim 9, further comprising:

coating the novolac positive photoresist containing the additive phenol dissolution accelerator on a given base material;

exposing via a given mask and developing the novolac positive photoresist, to form the pre-resist pattern; and ash-treating the pre-resist pattern to form the narrowed resist pattern.

11. A fabricating method as defined in claim 10, wherein the pre-resist pattern has a T-shaped or reversed trapezoid longitudinal cross-section, and the narrowed resist pattern has a corresponding T-shaped or reversed trapezoid cross-section.

12. A method for patterning a thin film using a resist pattern as defined in claim 1.

13. A method for patterning a thin film corresponding to a resist pattern narrowed below an optically theoretical limitation, comprising:

forming a thin film to be milled on a given base material;

forming a polymethylgiutarimide layer on the thin film to be milled;

forming a photoresist layer on the polymethylglutarimide layer;

exposing and developing the photoresist layer via a given mask;

partially removing the remaining polymethylglutarimide layer with an alkaline water solution to form a pre-resist pattern constructed of the photoresist layer as a top layer and the polymethylgiutarimide layer as a bottom layer;

increasing bond strength between the pre-resist pattern and the base material by increasing an amount of relative contact area of the pre-resist pattern and the base material by ash-treating the pre-resist pattern;

ash-treating the pre-resist pattern to form the narrowed resist pattern; and milling the thin film to be milled via the narrowed resist pattern to obtain a patterned thin film.

14. A patterning method as defined in claim 13, wherein the ashing treatment is carried out by using a process gas composed of oxygen gas containing at least one of fluorine-based gas and nitrogen/hydrogen gas mixture.

15. A patterning method as defined in claim 13, wherein the pre-resist pattern has a T-shaped or reversed trapezoid longitudinal cross section, and the narrowed resist pattern has a corresponding T-shaped or reversed trapezoid cross-section.

16. A method for patterning a thin film corresponding to a resist pattern narrowed below an optically theoretical limitation, comprising the steps of:

forming a thin film to be milled on a given base material;

coating on the thin film to be milled a picture reversion photoresist which is made by adding a negative working agent to a positive photoresist including a mixture of alkaline soluble phenol resin and napthoquinonediazide;

exposing the picture reversion photoresist via a given mask;

heating the picture reversion photoresist after the exposure treatment;

developing the picture reversion photoresist after the heating treatment to form a pre-resist pattern;

increasing bond strength between the pre-resist pattern and the base material by increasing an amount of relative contact area of the pre-resist pattern and the base material by ash-treating the pre-resist pattern;

ash-treating the pre-resist pattern to form the narrowed resist pattern; and milling the thin film to be milled via the narrowed resist pattern to obtain a patterned thin film.

17. A patterning method as defined in claim 16, further comprising exposing the picture reversion photoresist uniformly after the heating treatment and before the developing treatment.

18. A patterning method as defined in claim 16, wherein the ashing treatment is carried out by using a process gas composed of oxygen gas containing at least one of fluorine-based gas and nitrogen/hydrogen gas mixture.

19. A patterning method as defined in claim 16, wherein the pre-resist pattern has a T-shaped or reversed trapezoid longitudinal cross-section, and the narrowed resist pattern has a corresponding T-shaped or reversed trapezoid cross-section.

20. A method for patterning a thin film corresponding to a resist pattern narrowed below an optically theoretical limitation, comprising:

forming a thin film to be milled on a given base material;

coating a novolac positive photoresist containing an additive phenol dissolution accelerator on the thin film to be milled;

exposing via a given mask and developing the novolac positive photoresist, to form a pre-resist pattern;

increasing bond strength between the pre-resist pattern and the base material by increasing an amount of relative contact area of the pre-resist pattern and the base material by ash-treating the pre-resist pattern;

ash-treating the pre-resist pattern to form the narrowed resist pattern; and milling the thin film to be milled via the narrowed resist pattern to obtain a patterned thin film.

21. A patterning method as defined in claim 20, wherein the ashing treatment is carried out by using a process gas composed of oxygen gas containing at least one of fluorine-based gas and nitrogen/hydrogen gas mixture.

22. A patterning method as defined in claim 20, wherein the pre-resist pattern has a T-shaped or reversed trapezoid longitudinal cross-section, and the narrowed resist pattern has a corresponding T-shaped or reversed trapezoid cross-section.

23. A method for patterning a thin film corresponding to a resist pattern narrowed below an optically theoretical level, comprising:

forming a polymethylglutarimide layer on a given base material;

forming a photoresist layer on the polymethyiglutanmide layer;

exposing and developing the photoresist layer via a given mask;

partially removing the remaining polymethyiglutarimide layer will an alkaline water solution to form a pre-resist pattern constructed of the photoresist layer as a top layer and the polymethylglutarimide layer as a bottom layer;

increasing bond strength between the pre-resist pattern and the base material by increasing an amount of relative contact area of the pre-resist pattern and the base material by ash-treating the pre-resist pattern;

ash-treating the pre-resist pattern to form the narrowed resist pattern;

forming a thin film to be patterned on the base material so as to cover the narrowed resist pattern; and lifting-off the resist pattern to obtain a patterned thin film.

24. A patterning method as defined in claim 23, wherein the ashing treatment is carried out by using a process gas composed of oxygen gas containing at least one of fluorine-based gas and nitrogen/hydrogen gas mixture.

25. A patterning method as defined in claim 23, wherein the pre-resist pattern has a T-shaped or reversed trapezoid longitudinal cross-section, and the narrowed resist pattern has a corresponding T-shaped or reversed trapezoid cross-section.

26. A method for patterning a thin film corresponding to a resist pattern narrowed below an optically theoretical limitation, comprising:

coating on a given base material a picture reversion photoresist which is made by adding a negative working agent to a positive photoresist including a mixture of alkaline soluble phenol resin and napthoquinonediazide;

exposing the picture reversion photoresist via a given mask;

heating the picture reversion photoresist after the exposure treatment;

developing the picture reversion photoresist after the heating treatment to form a pre-resist pattern;

increasing bond strength between the pre-resist pattern and the base material by increasing an amount of relative contact area of the pre-resist pattern and the base material by ash-treating the pre-resist pattern;

ash-treating the pre-resist pattern to form the narrowed resist pattern;

forming a thin film to be patterned on the base material so as to cover the narrowed resist pattern; and lifting-off the resist pattern to obtain a patterned thin film.

27. A patterning method as defined in claim 26, further comprising exposing the picture reversion photoresist uniformly after the heating treatment and before the developing treatment.

28. A patterning method as defined in claim 26, wherein the ashing treatment is carried out by using a process gas composed of oxygen is containing at least one of fluorine-based gas and nitrogen/hydrogen gas mixture.

29. A patterning method as defined in claim 26, wherein the pre-resist pattern has a T-shaped or reversed trapezoid longitudinal cross-section, and the narrowed resist pattern has a corresponding T-shaped or reversed trapezoid cross-section.

30. A method for patterning a thin film corresponding to a resist pattern narrowed below an optically theoretical limitation comprising:

coating a novolac positive photoresist containing an additive phenol dissolution accelerator on a given base material;

exposing via a given mask and developing the novolac positive photoresist, to form a pre-resist pattern;

increasing bond strength between the pre-resist pattern and the base material by increasing an amount of relative contact area of the pre-resist pattern and the base material by ash-treating the pre-resist pattern;

ash-treating the pre-resist pattern to form the narrowed resist pattern;

forming a thin film to be patterned on the base material so as to cover the narrowed resist pattern; and lifting-off the resist pattern to obtain a patterned thin film.

31. A patterning method as defined in claim 30, wherein the ashing treatment is carried out by using a process gas composed of oxygen gas containing at least one of fluorine-based gas and nitrogen/hydrogen gas mixture.

32. A patterning method as defined in claim 30, wherein the pre-resist pattern has a T-shaped or reversed trapezoid longitudinal cross-section, and the narrowed resist pattern has a corresponding T-shaped or reversed trapezoid cross-section.

33. A method for patterning a thin film corresponding to a resist pattern narrowed below an optically theoretical limitation, comprising:

forming a thin film to be milled on a given base material;

forming a polymethylglutarimide layer on the thin film to be milled;

forming a photoresist layer on the polymethylglutarimide layer;

exposing and developing the photoresist layer via a given mask;

partially removing the remaining polymethylgiutarimide layer with an alkaline water solution to form a pre-resist pattern constructed of the photoresist layer as a top layer and the polymethylglutarimide layer as a bottom layer;

increasing bond strength between the pre-resist pattern and the base material by increasing an amount of relative contact area of the pre-resist pattern and the base material by ash-treating the pre-resist pattern;

ash-treating the pre-resist pattern to form the narrowed resist pattern;

milling the thin film to be milled via the narrowed resist pattern to form a pre-patterned thin film;

forming a thin film to be patterned on the base material so as to cover the narrowed resist pattern; and lifting-off the narrowed resist pattern to obtain a patterned thin film including the pre-patterned thin film.

34. A patterning method as defined in claim 33, wherein the ashing treatment is carried out by using a process gas composed of oxygen gas containing at least one of fluorine-based gas and nitrogen/hydrogen gas mixture.

35. A patterning method as defined in claim 33, wherein the pre-resist pattern has a T-shaped or reversed trapezoid longitudinal cross-section, and the narrowed resist pattern has a corresponding T-shaped or reversed trapezoid cross-section.

36. A method for patterning a thin film corresponding to a resist pattern narrowed below an optically theoretical limitation, comprising:

forming a thin film to be milled on a given base material;

coating on the thin film to be milled a picture reversion photoresist which is made by adding a negative working agent to a positive photoresist including a mixture of alkaline soluble phenol resin and napthoquinonediazide;

exposing the picture reversion photoresist via a given mask;

heating the picture reversion photoresist after the exposure treatment;

developing the picture reversion photoresist after the heating treatment to form a pre-resist pattern;

increasing bond strength between the pre-resist pattern and the base material by increasing an amount of relative contact area of the pre-resist pattern and the base material by ash-treating the pre-resist pattern;

ash-treating the pre-resist pattern to form the narrowed resist pattern;

milling the thin film to be milled via the narrowed resist pattern to obtain a pre-patterned thin film;

forming a thin film to be patterned on the base material so as to cover the narrowed resist pattern; and lifting-off the narrowed resist pattern to obtain a patterned thin film including the pre-patterned thin film.

37. A patterning method as defined in claim 36, further comprising exposing the picture reversion photoresist uniformly after the heating treatment and before the developing treatment.

38. A patterning method as defined in claim 36, wherein the ashing treatment is carried out by using a process gas composed of oxygen gas containing at least one of fluorine-based gas and nitrogen/hydrogen gas mixture.

39. A patterning method as defined in claim 36, wherein the pre-resist pattern has a T-shaped or reversed trapezoid longitudinal cross-section, and the narrowed resist pattern has a corresponding T-shaped or reversed trapezoid cross-section.

40. A method for patterning a thin film corresponding to a resist pattern narrowed below an optically theoretical limitation comprising:

forming a thin film to be milled on a given base material;

coating a novolac positive photoresist containing an additive phenol dissolution accelerator on the thin film to be milled;

exposing via a given mask and developing the novolac positive photoresist, to form a pre-resist pattern;

increasing bond strength between the pre-resist pattern and the base material by increasing an amount of relative contact area of the pre-resist pattern and the base material by ash-treating the pre-resist pattern;

ash-treating the pre-resist pattern to form the narrowed resist pattern;

milling the thin film to be milled via the narrowed resist pattern to obtain a pre-patterned thin film;

forming a thin film to be patterned on the base material so as to cover the narrowed resist pattern; and lifting-off the narrowed resist pattern to obtain a patterned thin film including the pre-patterned thin film.

41. A patterning method as defined in claim 40, wherein the ashing treatment is carried out by using a process gas composed of oxygen gas containing at least one of fluorine-based gas and nitrogen/hydrogen gas mixture.

42. A patterning method as defined in claim 40, wherein the pre-resist pattern has a T-shaped or reversed trapezoid longitudinal cross-section, and the narrowed resist pattern has a corresponding T-shaped or reversed trapezoid cross-section.

43. A method for manufacturing a micro device, using a patterning method for a thin film as defined in claim 12.

44. A manufacturing method as defined in claim 43, wherein the micro device is a thin film magnetic head.

45. A manufacturing method as defined in claim 44, wherein a magnetoresistive effective thin film element of the thin film magnetic head is manufactured by a patterning method comprising the steps: forming a thin film to be milled on a given base material, forming a polymethylgiutanmide layer on the thin film to be milled, forming a photoresist layer on the polymethyighitanmide layer, exposing and developing the photoresist layer via a given mask, partially removing the remaining polymethylglutarimide layer with an alkaline water solution to form a pre-resist pattern constructed of the photoresist layer as a top layer and the polymethyiglutanmide layer as a bottom layer, ash-treating the pre-resist pattern to form a narrowed resist pattern, and milling the thin film to be milled via the narrowed resist pattern to obtain a patterned thin film.

46. A method for fabricating a resist pattern narrowed below an optically theoretical limitation, comprising:

forming a pre-resist pattern through exposure treatment and development treatment, said pre-resist pattern being made of a novolac positive photoresist containing an additive phenol dissolution accelerator; and increasing bond strength between the pre-resist pattern and the base material by increasing an amount of relative contact area of the pre-resist pattern and the base material by ash-treating the pre-resist pattern; and ash-treating said pre-resist pattern to form the narrowed resist pattern.

* * * * *